United States Patent
Chang et al.

(10) Patent No.: US 7,074,674 B1
(45) Date of Patent: Jul. 11, 2006

(54) METHOD FOR MANUFACTURING ONE-TIME ELECTRICALLY PROGRAMMABLE READ ONLY MEMORY

(75) Inventors: Ko-Hsing Chang, Hsinchu (TW);
Tung-Po Chen, Taichung (TW);
Tung-Ming Lai, Hsinchu (TW);
Chen-Chiu Hsue, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 11/160,176

(22) Filed: Jun. 13, 2005

(30) Foreign Application Priority Data

Jan. 13, 2005 (TW) .............................. 94100955 A

(51) Int. Cl.
*H01L 21/336* (2006.01)
(52) U.S. Cl. ................. 438/257; 438/263; 438/265
(58) Field of Classification Search ............... 438/257, 438/263, 265
See application file for complete search history.

(56) References Cited

U.S. PATENT DOCUMENTS

| 5,930,628 A | * | 7/1999 | Chang ........................ 438/258 |
| 6,678,190 B1 | | 1/2004 | Yang et al. ................. 365/185 |
| 7,015,100 B1 | * | 3/2006 | Lee et al. .................... 438/257 |

* cited by examiner

*Primary Examiner*—Jack Chen
(74) *Attorney, Agent, or Firm*—Jianq Chyun IP Office

(57) ABSTRACT

A method for manufacturing an OTEPROM is described. A tunneling oxide layer, a first conductive layer, a first patterned mask layer are formed on a substrate. A trench is formed in the substrate. An insulating layer is formed to fill the trench. A portion of the first conductive layer destined to form the floating gate is exposed and then a cap layer is formed thereon. The first patterned mask layer is removed and then a second conductive layer and a second patterned mask layer are formed over the substrate. A word line and a floating gate are formed using the second patterned mask layer and the cap layer as a mask. The second patterned mask layer is removed and then source/drain regions are formed in the substrate on both sides of the word line and the floating gate and between the word line and the floating gate.

17 Claims, 7 Drawing Sheets

US 7,074,674 B1

METHOD FOR MANUFACTURING ONE-TIME ELECTRICALLY PROGRAMMABLE READ ONLY MEMORY

CROSS-REFERENCE TO RELATED APPLICATION

This application claims the priority benefit of Taiwan application serial no. 94100955, filed on Jan. 13, 2005. All disclosure of the Taiwan application is incorporated herein by reference.

BACKGROUND OF THE INVENTION

1. Field of the Invention

The present invention relates to a semiconductor device. More particularly, the present invention relates to a method for manufacturing a one-time electrically programmable read only memory (OTEPROM).

2. Description of the Related Art

As semiconductor production enters the deep sub-micron stage, the dimension of devices is significantly miniaturized. For memory devices, this represents a significant reduction in the size of each memory cell. As the amount of data that needs to be processed and stored in an electronic communication product (such as a computer, a mobile phone, a digital camera or a personal digital assistant) continues to increase, the memory storage capacity required by these electronic communication products increases at an accelerating rate. With the rapid improvement in semiconductor manufacturing techniques, most semiconductor processes are aiming towards increasing the density of devices in a wafer and miniaturizing the size of each device so that overall level of integration can be increased. In other words, there is a great demand for small size but high storage capacity memory devices. How to produce small, highly integrated, high capacity and high quality memory devices is the common goal for all device manufacturers.

According to the difference in read/write function, memory can be simply categorized into read only memory (ROM) and random access memory (RAM). Because the memory messages or data stored in the read only memory will not be deleted even when the power to the device is cut off, this type of memory is also called non-volatile memory.

In general, read only memory can be further divided into erasable programmable read only memory (EPROM), one-time electrically programmable read only memory (OTEPROM), electrically erasable programmable read only memory (EEPROM) and mask read only memory (mask ROM).

The one-time electrically programmable read only memory (OTEPROM) permits the writing of data into the memory after leaving the factory. That is, the data can be written by the user to fit a particular memory environment, which is more convenient to a user.

FIG. 1 is a top view of a conventional OTEPROM. FIG. 2 is a schematic cross-sectional view taken along line A–A' of the OTEPROM in FIG. 1.

As shown in FIGS. 1 and 2, the OTEPROM includes a memory cell 10 and a memory cell 20. Since the memory cell 10 and the memory cell 20 are structurally the same, only the memory cell 10 is described.

The memory cell 10 mainly includes a substrate 100, a polysilicon floating gate 101, a word line 103, a plurality of gate dielectric layers 104, a plurality of source/drain regions 105, a plurality of device isolation structures 107 and a plurality of spacers 109. The polysilicon floating gate 101 and the word line 103 are disposed on the substrate 100. The gate dielectric layers 104 are disposed between the substrate and the polysilicon floating gate 101 and the word line 103. The source/drain regions 105 are disposed in the substrate 100 adjacent to the sides of the polysilicon floating gate 101 and the word line 103. The device isolation structures 107 are disposed in the substrate 100. The spacers 109 are disposed on the sidewalls of the polysilicon floating gate 101 and the word line 103.

In the process of manufacturing the aforementioned OTEPROM, the polysilicon floating gate 101 is directly patterned using the photolithographic and etching technique. However, photolithographic technique is often limited by the so-called optical limitations. To prevent any misalignment in the photolithographic process or any damages to the polysilicon layer by etching solution in the etching operation when patterning out the polysilicon floating gate 101, a portion of the polysilicon floating gate 101 will extend into the device isolation structure 107. Hence, after the polysilicon floating gate 101 has been patterned, its dimension will be greater than the originally required area (in FIG. 1, 'a' is the reserved area). Yet, the reserved area in the aforementioned structure is simply a waste of the substrate area, which is contrary to the current trend in semiconductor fabrication.

SUMMARY OF THE INVENTION

Accordingly, at least one objective of the present invention is to provide a method for manufacturing an OTEPROM that can reduce size of each device and increase the level of device integration.

At least a second objective of the present invention is to provide a method for manufacturing an OTEPROM that a self-aligned process is utilized to form a polysilicon floating gate. This prevents the formation of a conductive path between source region and drain region caused by the implantation process that might lead to device malfunction.

To achieve these and other advantages and in accordance with the purpose of the invention, as embodied and broadly described herein, the invention provides a method for manufacturing an OTEPROM. First, a substrate is provided. A tunneling dielectric layer is formed over the substrate and then a first conductive layer is formed over the tunneling dielectric layer. Then, a first patterned mask layer is formed over the first conductive layer. Using the first patterned mask layer as a mask, a portion of the first conductive layer, the tunneling dielectric layer, the substrate is removed to form a trench in the substrate. After that, an insulating layer that completely fills the trench is formed over the substrate. Then, a portion of the insulating layer is removed until the first patterned mask layer is exposed. A portion of the first patterned mask layer is removed to expose a portion of the first conductive layer destined for forming the floating gate. Afterwards, a cap layer is formed over the exposed first conductive layer. Next, the first patterned mask layer is removed and then a second conductive layer is formed over the substrate. A second patterned mask layer is formed over the second conductive layer. Using the second patterned mask layer and the cap layer as a mask, a portion of the second conductive layer and the first conductive layer is removed to form a word line and a floating gate. After that, the second patterned mask layer is removed. Finally, source/drain regions are formed in the substrate on both outer sides of the word line and the floating gate and also between the word line and the floating gate.

According to the aforementioned preferred embodiment of manufacturing the OTEPROM of the present invention, the tunneling dielectric layer and the cap layer are formed by performing a thermal oxidation process. Furthermore, after removing the second patterned mask layer, lightly doped regions are formed in the substrate on both outer sides of the word line and the floating gate and also between the word line and the floating gate. After forming the lightly doped regions, spacers are formed on the sidewalls of the word line and the floating gate. The method of forming the spacers includes depositing insulating material over the substrate to form an insulating layer and then performing an anisotropic etching operation to remove a portion of the insulating layer. In addition, before forming the lightly doped regions, insulation layers are formed on the sidewalls of the word line and the floating gate. The method of forming the insulation layers includes performing a thermal oxidation.

The present invention also provides another method for manufacturing an OTEPROM. First, a substrate is provided. The substrate has an active region defined through a plurality of device isolation structures. Furthermore, a tunneling dielectric layer, a first conductive layer and a first mask layer are sequentially formed over the active region. Then, the first mask layer is patterned to expose a portion of the first conductive layer destined to form the floating gate. A cap layer is formed over the exposed first conductive layer and then the mask layer is removed. After that, a second conductive layer is formed over the substrate and then a second patterned mask layer is formed over the second conductive layer. Using the second patterned mask layer and the cap layer as a mask, a portion of the second conductive layer and the first conductive layer is removed to form a word line and a floating gate. Then, the second patterned mask layer is removed. Next, insulation layers are formed on the sidewalls of the word line and the floating gate. Finally, source/drain regions are formed in the substrate on both outer sides of the word line and the floating gate and also between the word line and the floating gate.

According to the aforementioned preferred embodiment of manufacturing the OTEPROM of the present invention, the tunneling dielectric layer and the cap layer are formed by performing a thermal oxidation process. Furthermore, after forming the insulation layers, lightly doped regions are formed in the substrate on both outer sides of the word line and the floating gate and also between the word line and the floating gate. After forming the lightly doped regions, spacers are formed on the sidewalls of the word line and the floating gate. The method of forming the spacers includes depositing insulating material over the substrate to form an insulating layer and then performing an anisotropic etching operation to remove a portion of the insulating layer. In addition, the method of forming the insulation layers includes performing a thermal oxidation.

Since the method of manufacturing OTEPROM according to the present invention is able to resolve the problem of memory cells occupying too much substrate area, the size of each memory cell can be reduced. Consequently, overall level of device integration is increased.

Furthermore, using the shallow trench isolation (STI) technique to define the floating gate can prevent damage of the original area destined to become the floating gate resulting from the process of etching the polysilicon layer to form the floating gate in the conventional manufacturing method. Thus, the problem that implanted dopants causing source/drain regions electrically connected and resulting in device malfunction during the source/drain formation process can be solved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
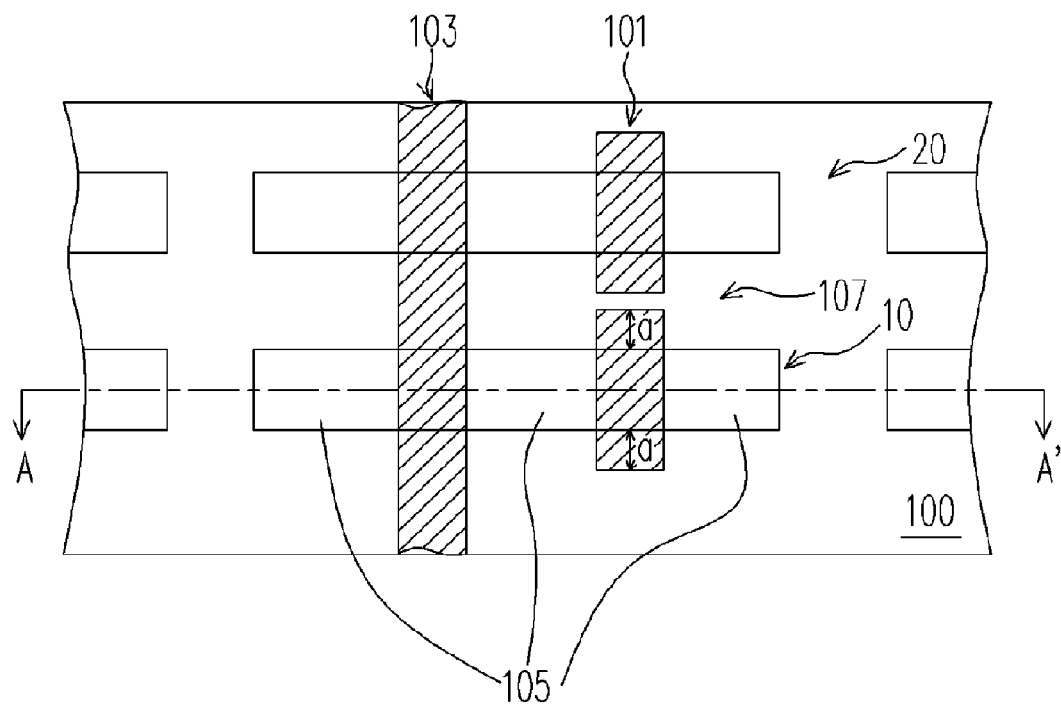
FIG. 1 is a top view of a conventional OTEPROM.
Figure 2:
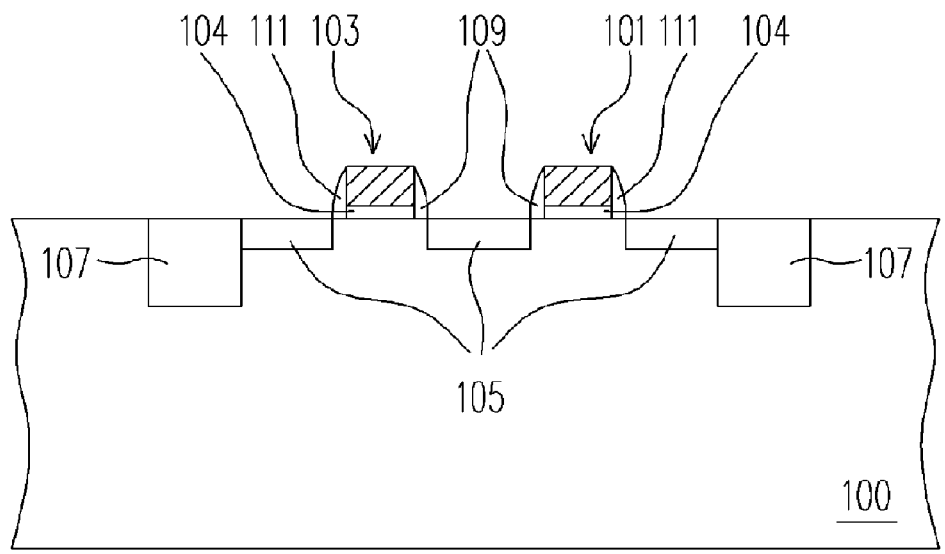
FIG. 2 is a schematic cross-sectional view along line A–A' of the OTEPROM in FIG. 1.

Reference will now be made in detail to the present preferred embodiments of the invention, examples of which are illustrated in the accompanying drawings. Wherever possible, the same reference numbers are used in the drawings and the description to refer to the same or like parts.

The conventional method for manufacturing an OTEPROM has been explained in detail. Since the conventional method of manufacturing an OTEPROM can not provide best performance for the device after the device size has been reduced, the present invention is an improvement to the conventional manufacturing method. Because the method for manufacturing an OTEPROM according to the present invention integrates with shallow trench isolation (STI) technique, the dimension of each device is reduced and overall level of integration is increased. The following embodiment is used to illustrate the application of the present invention. However, this should by no means limit the applications of the present invention as such. The present invention can be applied to any semiconductor manufacturing process related to the production of OTEPROM.

Figure 3:
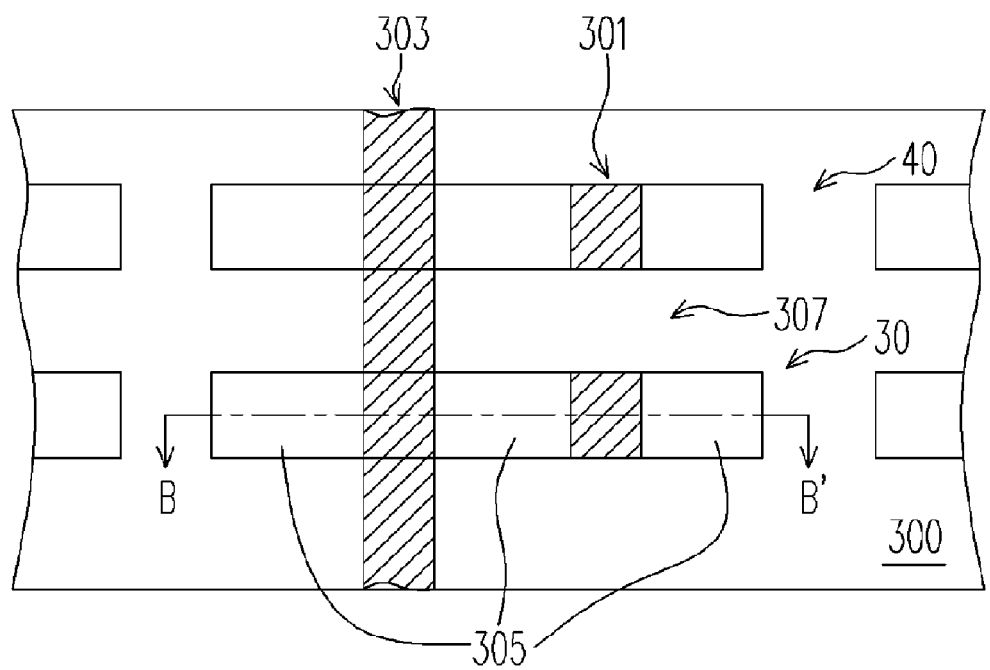
FIG. 3 is a top view of an OTEPROM according to one preferred embodiment of the present invention.
Figure 4:
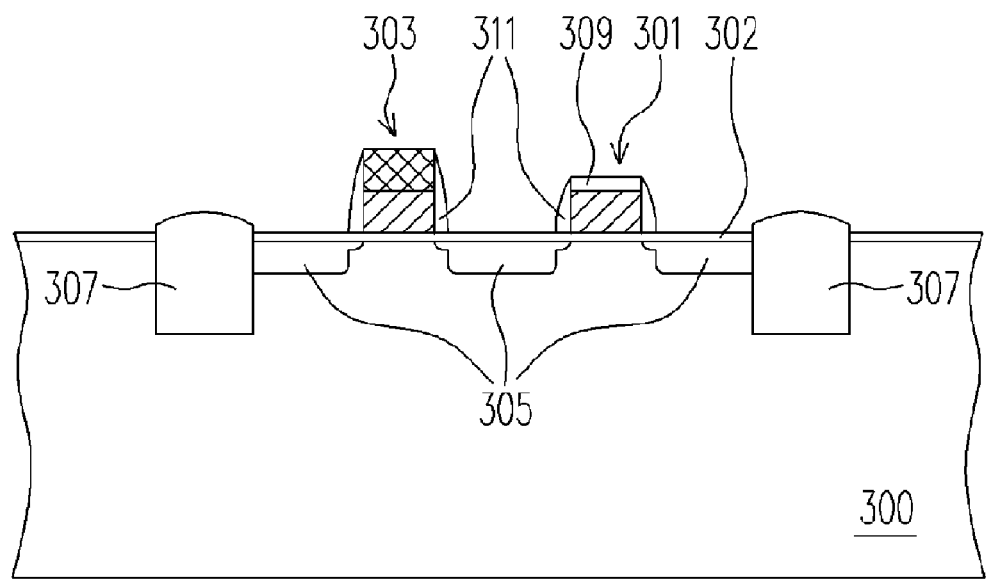
FIG. 4 is a schematic cross-sectional view taken along line B–B' of the OTEPROM in FIG. 3 according to one preferred embodiment of the present invention.

FIG. 3 is a top view of an OTEPROM according to one preferred embodiment of the present invention. FIG. 4 is a schematic cross-sectional view along line B–B' of the OTEPROM in FIG. 3 according to one preferred embodiment of the present invention.

As shown in FIGS. 3 and 4, the memory cell 30 includes a substrate 300, a polysilicon floating gate 301, a tunneling dielectric layer 302, a word line 303, a plurality of source/drain regions 305, a plurality of device isolation structures 307, a cap layer 309 and a plurality of spacers 311. Compared FIG. 3 with FIG. 1, the area labeled 'a' is gone. In other words, the manufacturing method in the present invention basically resolves the problem having memory cells that waste substrate area.

FIGS. 5A through 5E are top views showing the steps for fabricating an OTEPROM according to one preferred embodiment of the present invention. FIGS. 6A through 6E are schematic cross-sectional views along line B–B' of FIGS. 5A through 5E.

Figure 5A:
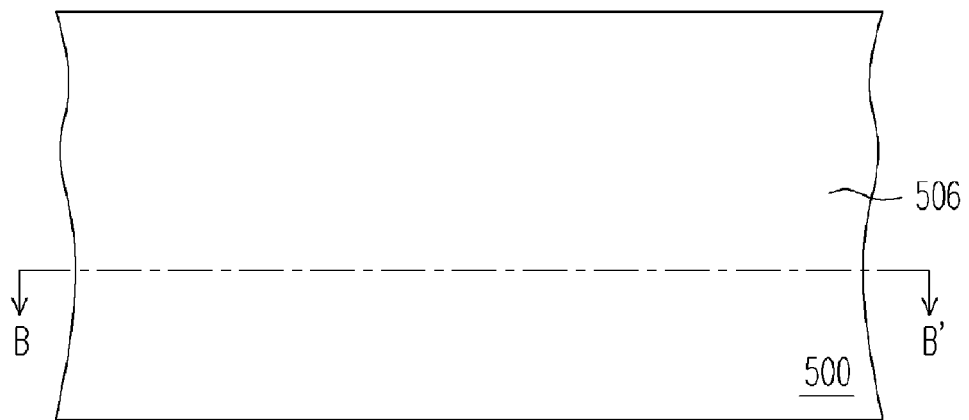
FIGS. 5A through 5E are top views showing the steps for fabricating an OTEPROM according to one preferred embodiment of the present invention.
Figure 6A:
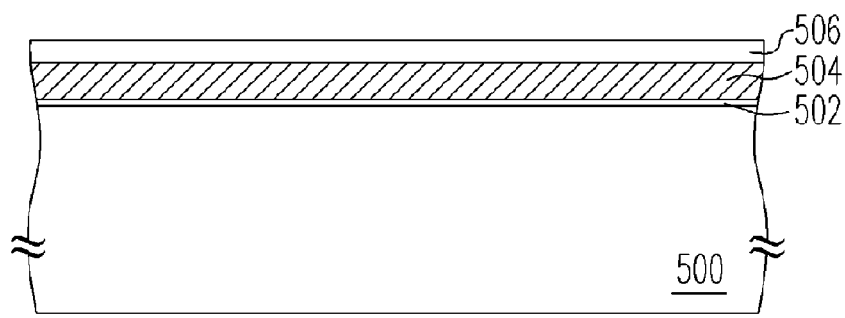
FIGS. 6A through 6E are schematic cross-sectional views along line B–B' of FIGS. 5A through 5E.

First, as shown in FIGS. 5A and 6A, a substrate 500 is provided. Then, a tunneling dielectric layer 502, a conductive layer 504 and a mask layer 506 are sequentially formed over the substrate 500. The tunneling dielectric layer 502 is a silicon oxide ($SiO_2$) layer formed, for example, by performing a thermal oxidation process. The conductive layer 504 is fabricated using, for example, doped polysilicon or other suitable material. There are two methods for forming the doped polysilicon layer. The first method includes depositing undoped polysilicon and then performing an ion implantation to implant the required dopants into the polysilicon layer. Alternatively, an in-situ doping process is carried out to implant the required dopants when polysilicon material is deposited. The method of forming the conductive layer 504 includes performing a chemical vapor deposition (CVD) process. The mask layer 506 is a silicon nitride layer ($Si_3N_4$) layer formed, for example, by performing a chemical vapor deposition process or other suitable process.

Figure 5B:
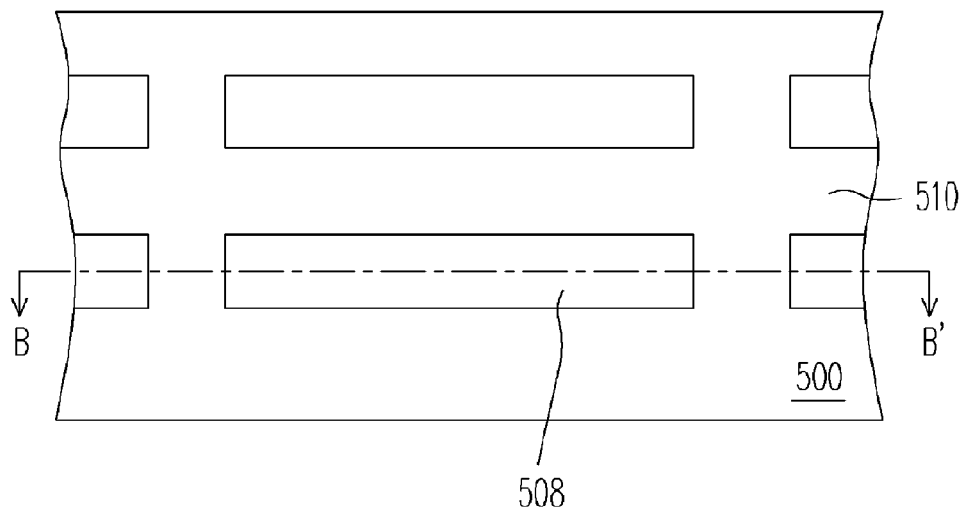
Figure 6B:
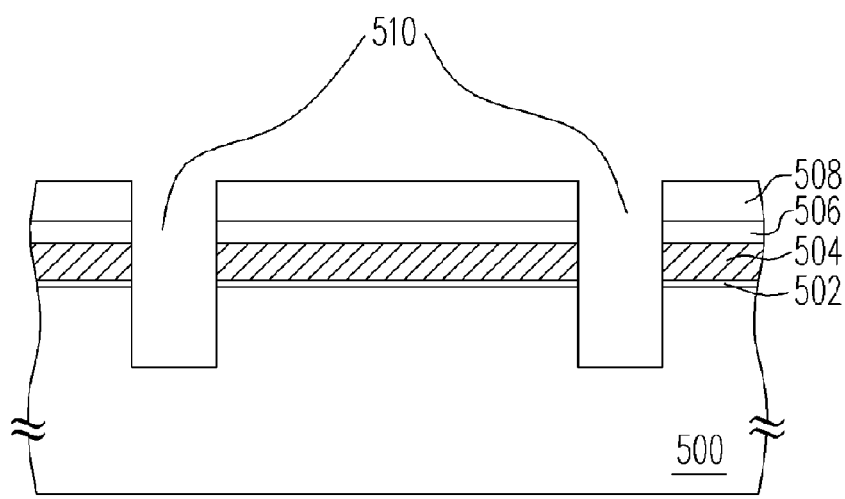

As shown in FIGS. 5B and 6B, a patterned photoresist layer 508 is formed over the mask layer 506. The patterned photoresist layer 508 serves as a mask for removing a portion of the mask layer 506, the conductive layer 504, the tunneling dielectric layer 502, the substrate 500 to form a trench 510 in the substrate 500. The trench 510 cuts through the conductive layer 504 so that the remaining conductive layer 504 forms a linear strip underneath the mask layer 506.

Figure 5C:
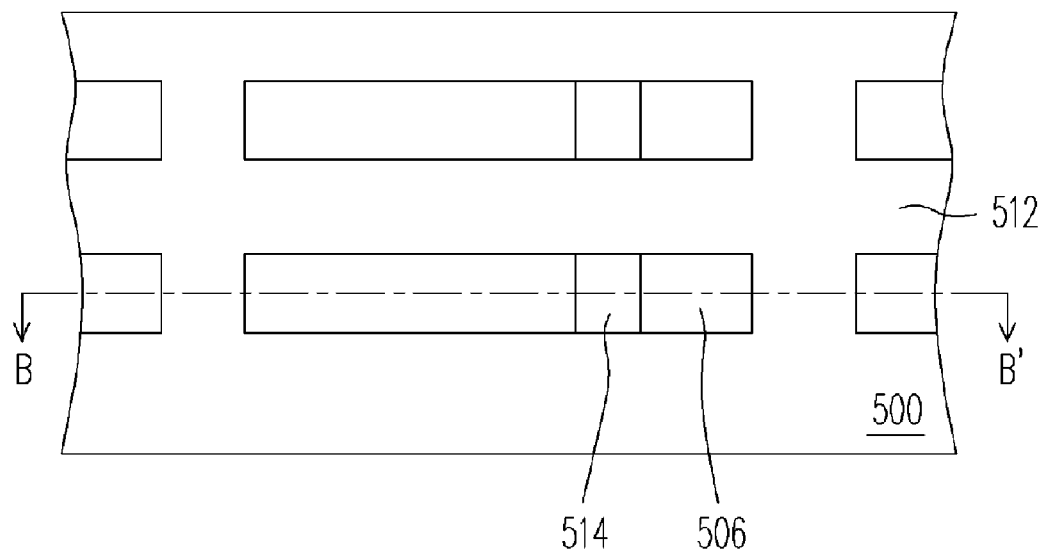
Figure 6C:
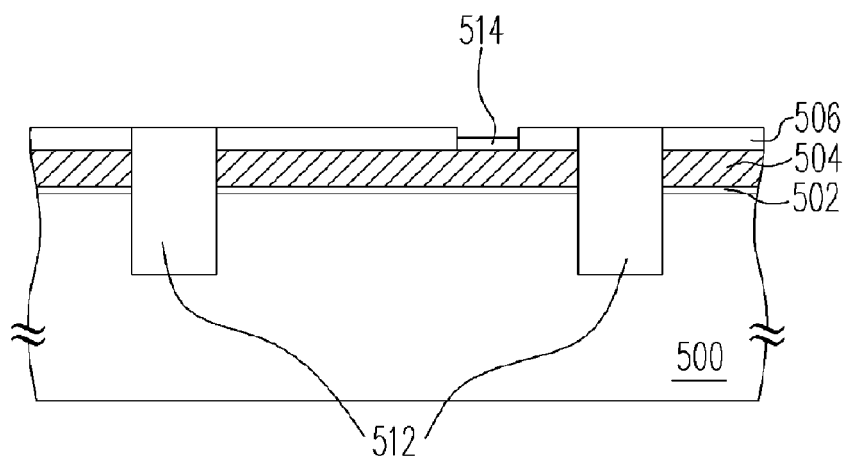

As shown in FIGS. 5C and 6C, an insulating layer (not shown) that completely fills the trench 510 is formed over the substrate 500. The insulating layer is a silicon oxide layer formed, for example, by performing a chemical vapor deposition process. Then, a portion of the insulating layer is removed until the mask layer 506 is exposed to form isolation structures 512. The method of removing a portion of the insulating layer includes performing a chemical mechanical polishing (CMP), for example. Next, the mask layer 506 is patterned to expose that portion of the conductive layer 504 destined to become the floating gate. After that, a cap layer 514 is formed over the exposed conductive layer 504. The cap layer 514 is a silicon oxide layer formed, for example, by performing a thermal oxidation. Alternatively, the cap layer 514 is formed, for example, by depositing silicon oxide in a chemical vapor deposition and etching back the silicon oxide layer thereafter.

Figure 5D:
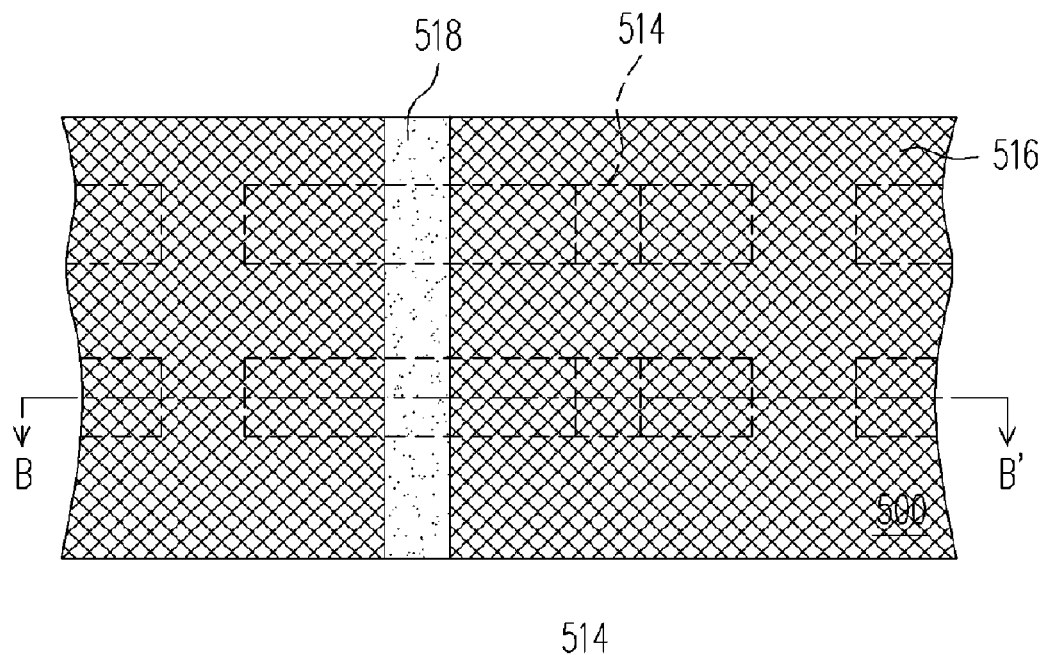
Figure 6D:
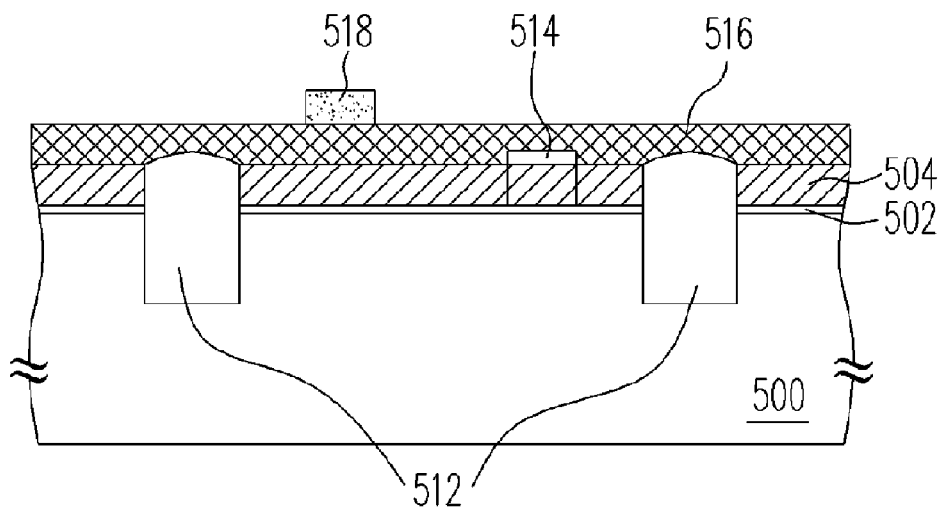

As shown in FIGS. 5D and 6D, the mask layer 506 is removed and then another conductive layer 516 is formed over the substrate 500. The conductive layer 516 is a doped polysilicon layer or other suitable material layer, for example. The method of forming the conductive layer 516 includes performing a chemical vapor deposition process, for example. Then, a patterned photoresist layer 518 is formed over the conductive layer 516.

Figure 5E:
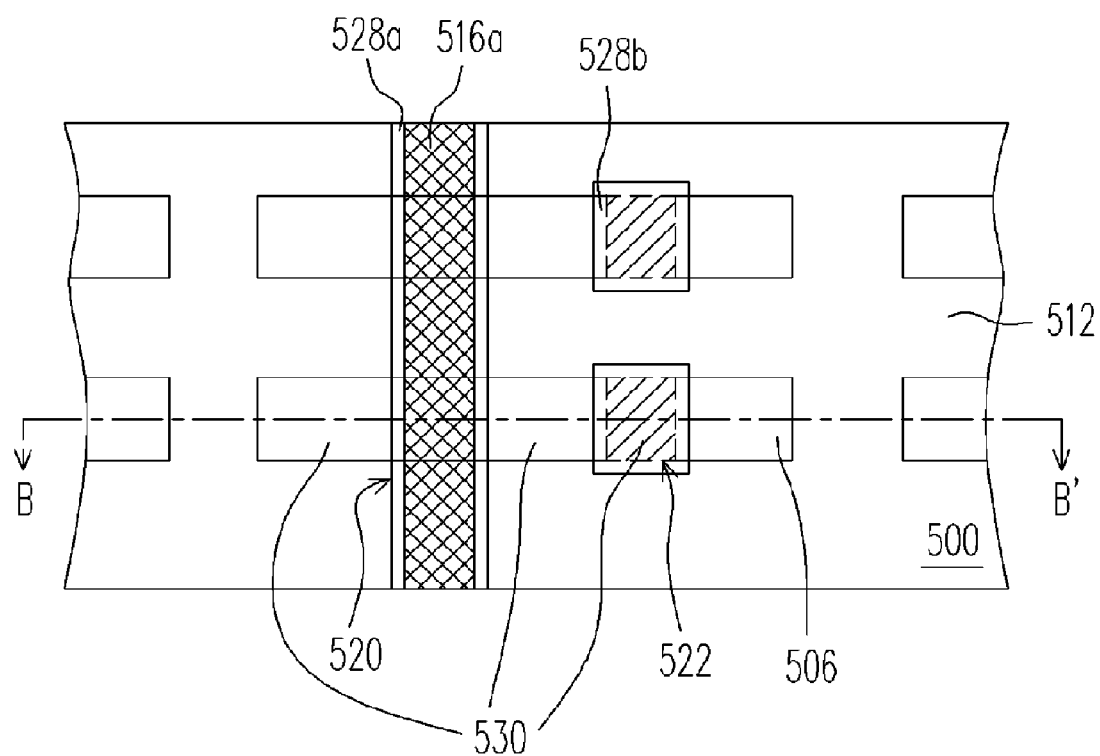
Figure 6E:
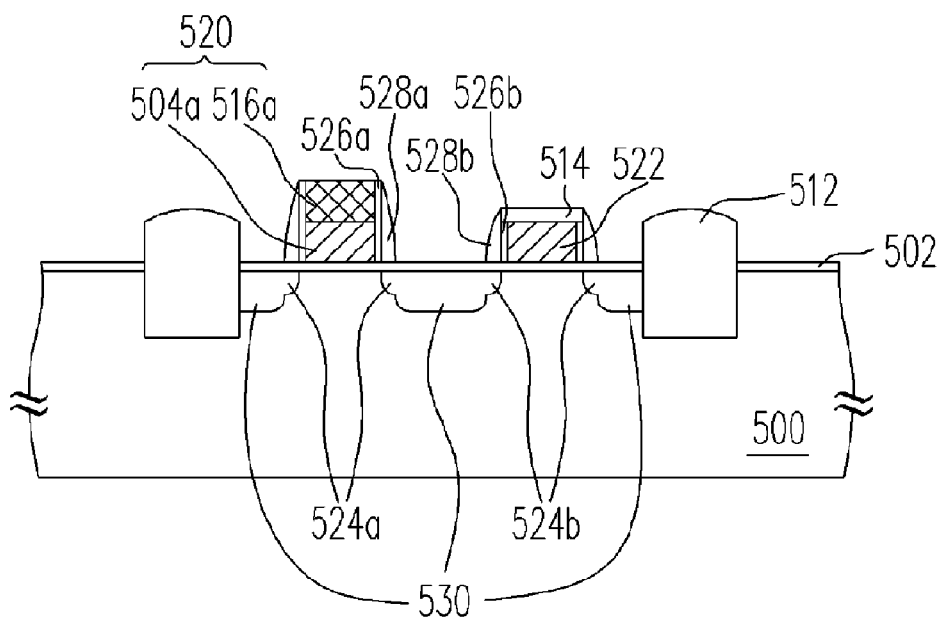

As shown in FIGS. 5E and 6E, using the patterned photoresist layer (mask layer) 518 and the cap layer 514 as a mask, a portion of the conductive layer 516 and the conductive layer 514 are removed to form a word line 520 and a floating gate 522. The word line 520 includes a conductive layer 504a and a conductive layer 516a and serves as a control gate for turning the floating gate 522 on or off. In the present invention, the floating gate 522 is controlled by the word line 520 to write data in once and the stored data, in the form of trapped electrons, are erased by illuminating the device with ultraviolet rays. Hence, the memory is called a one-time electrically programmable memory.

Next, the patterned photoresist layer 518 is removed. After removing the patterned photoresist layer 518, insulation layers 526a and 526b are formed on the sidewalls of the word line 520 and the floating gate 522. The method of forming the insulation layers 526a and 526b includes performing a thermal oxidation, for example. Because the defects are easily formed on the sidewalls in the etching process for forming the word line 520 and the floating gate 522, the insulation layers 526a and 526b formed in a high-temperature oxidation process is a means of repairing the sidewalls. Since this high-temperature oxidation is non-essential in the present invention, this step can be selectively skipped.

After forming the insulation layers 526a and 526b, lightly doped regions 524a and 524b are formed in the substrate 500 on both the outward and inward facing sides of the word line 520 and the floating gate 522.

After forming the lightly doped regions 524a and 524b, another spacers 528a and 528b are formed on the sidewalls of both the word line 520 and the floating gate 522. The method of forming the spacers 528a and 528b includes forming an insulating material layer (not shown) over the substrate and performing an anisotropic etching operation to remove a portion of the insulating material layer. Finally, doped regions 530 are formed in the substrate 500 on the outward-facing side and the inward-facing side of the word line 520 and the floating gate 522. The doped regions 530 are p-doped regions, for example. The lightly doped regions 524a and 524b and the doped regions 530 together form the source/drain regions.

Because the method for manufacturing an OTEPROM according to the present invention integrates with shallow trench isolation (STI) technique, the present invention is able to resolve the problem of memory cells occupying too much substrate area surface.

In summary, the present invention is able to meet the current trend of producing semiconductor devices having a smaller dimension and a higher packing? (package?) density. Particularly, by integrating the conventional shallow trench isolation technique with the present method of fabricating a non-volatile memory, the size of each device is reduced to provide additional space for increasing the level of integration.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a one-time electrically programmable read only memory, comprising the steps of:
   providing a substrate;
   forming a tunneling dielectric layer over the substrate;
   forming a first conductive layer over the tunneling dielectric layer;
   forming a first patterned mask layer over the first conductive layer;
   removing a portion of the first conductive layer, the tunneling dielectric layer and the substrate using the first patterned mask layer as a mask and forming a device isolation structure therein;
   removing a portion of the first patterned mask layer to expose a portion of the first conductive layer destined to form a floating gate;

forming a cap layer over the exposed first conductive layer;

removing the first patterned mask layer;

forming a second conductive layer over the substrate;

forming a second patterned mask layer over the second conductive layer;

removing a portion of the second conductive layer and the first conductive layer using the second patterned mask layer and the cap layer as a mask to form a word line and a floating gate;

removing the second patterned mask layer; and forming doped regions in the substrate on both the outer sides of the word line and the floating gate and also between the word line and the floating gate.

2. The method of claim 1, wherein the step of forming the tunneling dielectric layer includes performing a thermal oxidation process.

3. The method of claim 1, wherein the step of forming the cap layer includes performing a thermal oxidation process.

4. The method of claim 1, wherein after removing the second patterned mask layer, further comprises a step of forming lightly doped regions in the substrate on both outer sides of the word line and the floating gate and also between the word line and the floating gate.

5. The method of claim 4, wherein after forming the lightly doped regions, further comprises a step of forming spacers on the sidewalls of both the word line and the floating gate.

6. The method of claim 5, wherein the step for forming the spacers comprises:

forming an insulating material layer over the substrate; and performing an anisotropic etching process to remove a portion of the insulating material layer.

7. The method of claim 4, wherein before forming the lightly doped regions, further comprises a step of forming insulation layers on the sidewalls of both the word line and the floating gate.

8. The method of claim 7, wherein the step for forming the insulation layers includes performing a thermal oxidation process.

9. The method of claim 7, wherein the doped regions are p-type doped regions.

10. A method for manufacturing a one-time electrically programmable read only memory, comprising the steps of:

providing a substrate having a device isolation structure for defining an active region, wherein a tunneling dielectric layer, a first conductive layer and a first mask layer are formed in sequence thereon and the device isolation structure cuts the first conductive layer up to produce a linear strip;

patterning the first mask layer to expose a portion of the first conductive layer destined to formed a floating gate;

forming a cap layer over the exposed first conductive layer;

removing the first mask layer;

forming a second conductive layer over the substrate;

forming a second patterned mask layer over the second conductive layer;

removing a portion of the second conductive layer and the first conductive layer using the second patterned mask layer and the cap layer as a mask to form a word line and a floating gate;

removing the second patterned mask layer;

forming insulation layers on the sidewalls of the word line and the floating gate; and forming doped regions in the substrate on both outer sides of the word line and the floating gate and also between the word line and the floating gate.

11. The method of claim 10, wherein the step of forming the tunneling dielectric layer includes performing a thermal oxidation process.

12. The method of claim 10, wherein the step of forming the cap layer includes performing a thermal oxidation process.

13. The method of claim 12, wherein after forming the insulation layers, further comprises a step of forming lightly doped regions in the substrate on both outer sides of the word line and the floating gate and also between the word line and the floating gate.

14. The method of claim 13, wherein after forming the lightly doped regions, further comprises a step of forming spacers on the sidewalls of both the word line and the floating gate.

15. The method of claim 14, wherein the step for forming the spacers comprises:

forming an insulating material layer over the substrate; and performing an anisotropic etching process to remove a portion of the insulating material layer.

16. The method of claim 10, wherein the step for forming the insulation layers includes performing a thermal oxidation process.

17. The method of claim 10, wherein the doped regions are p-type doped regions.

* * * * *